United States Patent
Schultz et al.

(10) Patent No.: US 7,370,257 B2
(45) Date of Patent: May 6, 2008

(54) TEST VEHICLE DATA ANALYSIS

(75) Inventors: Richard Schultz, Fort Collins, CO (US); Gerald Shipley, Hillsboro, OR (US); Derryl Allman, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 390 days.

(21) Appl. No.: 11/102,156

(22) Filed: Apr. 8, 2005

(65) Prior Publication Data

US 2006/0242522 A1 Oct. 26, 2006

(51) Int. Cl.
*G01R 31/28* (2006.01)
*H01L 23/58* (2006.01)

(52) U.S. Cl. ............... 714/734; 714/724; 714/733; 714/25; 714/30; 257/48; 702/108; 702/118; 438/14

(58) Field of Classification Search ............... None
See application file for complete search history.

(56) References Cited

U.S. PATENT DOCUMENTS

| | | | |
|---|---|---|---|
| 4,801,869 A * | 1/1989 | Sprogis ............... 714/733 |
| 5,199,035 A * | 3/1993 | Lopez et al. ............... 714/820 |
| 5,299,204 A * | 3/1994 | Daniel ............... 714/724 |
| 5,674,651 A | 10/1997 | Nishi | |
| 5,764,654 A * | 6/1998 | Ohba et al. ............... 714/724 |
| 6,092,223 A | 7/2000 | Ahn | |
| 6,185,706 B1 * | 2/2001 | Sugasawara ............... 714/724 |
| 6,436,741 B2 | 8/2002 | Sato et al. | |
| 6,483,176 B2 | 11/2002 | Noguchi et al. | |
| 6,707,064 B2 | 3/2004 | Jang et al. | |
| 6,781,151 B2 | 8/2004 | Schultz et al. | |
| 6,861,864 B2 | 3/2005 | Schultz | |
| 6,885,950 B2 | 4/2005 | Mitsutake et al. | |
| 2004/0031008 A1 | 2/2004 | Satoh et al. | |
| 2005/0138499 A1 * | 6/2005 | Pileggi et al. ............... 714/724 |

* cited by examiner

*Primary Examiner*—Cynthia Britt
*Assistant Examiner*—John P Trimmings
(74) *Attorney, Agent, or Firm*—Krajec Patent Offices, LLC

(57) ABSTRACT

A system and method for collecting and analyzing integrated circuit test vehicle test data by identifying various blocks of circuitry through at least two different intersecting test paths. In one embodiment, the process test circuits may be arranged in a matrix format and connected so that they may be tested along rows or columns. When a failure along a specific row and a specific column is identified, the process test circuit at the intersection may be identified as the failure point.

17 Claims, 5 Drawing Sheets

TEST VEHICLE DATA ANALYSIS

BACKGROUND OF THE INVENTION a. Field of the Invention

The present invention pertains generally to processing integrated circuits and specifically to analyzing data from a test vehicle for process improvement and control.

b. Description of the Background

Test vehicles are special integrated circuits that are manufactured on a production line then are carefully analyzed to calculate probable yields and identify any processing problems. Test vehicles may have many different types of patterns that are on the outer limits of the capabilities of the manufacturing process in different ways. In order to most accurately identify processing problems, various test features are often designed into a test vehicle, such making probe points available on the surface of the integrated circuit and arranging the circuitry so that the integrated circuit may be efficiently examined.

Because of the density of devices and traces on today's integrated circuits, the complexity and cost of devices used to test integrated circuits is very high. Further, the production of test vehicles consumes valuable manufacturing time that would otherwise be put to use manufacturing products for sale and revenue. Consequently, the number of test vehicles that can be built and tested is very limited and any data that can come from a particular test vehicle is valuable.

One important set of data that comes from an analysis of a test vehicle is a precise description of an actual failure. Isolating and identifying a failure helps the process engineer fine tune the process and also is critical to developing reliable statistical data about the process. The statistical data are used for estimating yields as well as process refinement.

It would therefore be useful to provide a system and method for obtaining and analyzing test vehicle test data that reliably and efficiently isolates problems and creates reliable and useful data.

SUMMARY OF THE INVENTION

The present invention provides a system and method for collecting and analyzing integrated circuit test vehicle test data by identifying various blocks of circuitry through at least two different intersecting test paths. In one embodiment, the process test circuits may be arranged in a matrix format and connected so that they may be tested along rows or columns. When a failure along a specific row and a specific column is identified, the process test circuit at the intersection may be identified as the failure point.

An embodiment may include a system comprising: an integrated circuit comprising: a plurality of process test circuits; at least one data collection circuit; and a control circuit capable of switching one or more of the plurality of process test circuits to connect to one of the at least one data collection circuit; a test device adapted to connect to at least one of the plurality of process test circuits, set the control circuits to one of the at least one data collection circuit, send signals through the process test circuits, and collect a plurality of sets of data using the at least one data collection circuit for more than one combination of the process test circuits and the data collection circuit; a test analyzer adapted to compare the sets of data, determine that a failure exists, and isolate the failure to one or more of the plurality of process test circuits, the data collection circuit, or the control circuit.

Another embodiment may include a method comprising: testing a first process test circuit and recording first data using a first data collection circuit; testing a second process test circuit and recording second data using the first data collection circuit; testing the first process test circuit and recording third data using a second data collection circuit; testing the second process test circuit and recording forth data using the second data collection circuit; and comparing the first data, the second data, the third data, and the fourth data to isolate a failure in one of the first process test circuit, the second process test circuit, the first data collection circuit, and the second data collection circuit; wherein the first process test circuit, the second process test circuit, the first data collection circuit, and the second data collection circuit are all embodied on a single integrated circuit.

The advantages of the present invention include the ability to separate process circuit failures from data collection or control circuitry, resulting in a more accurate measure of process capabilities and faster, more meaningful failure analysis of the test vehicle circuitry. An additional advantage is that many individual process test circuits may be tested and analyzed with significantly fewer tests while yielding a more precise location of a failure than with other systems.

DETAILED DESCRIPTION OF THE INVENTION

Figure 1:
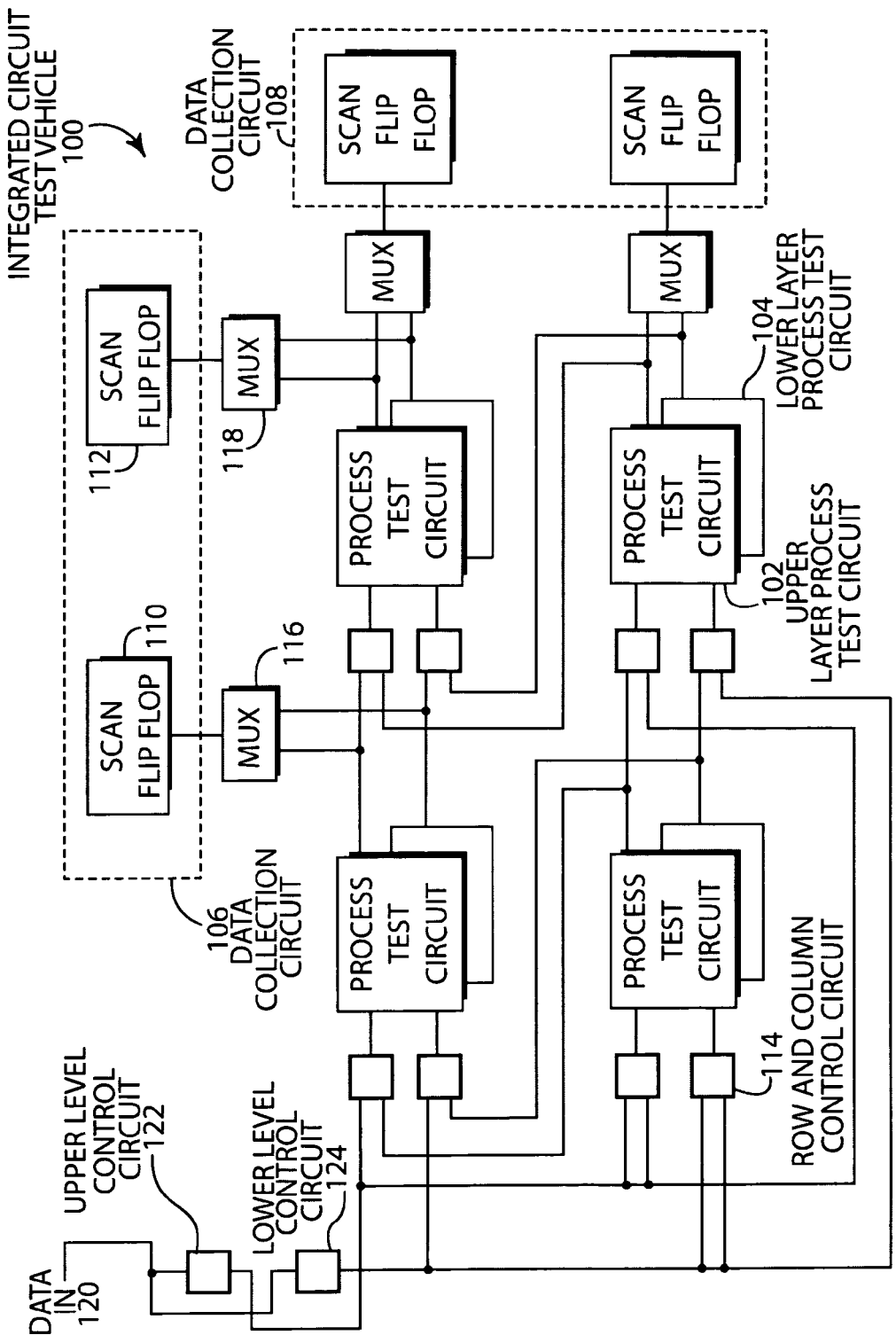
FIG. 1 is a block diagram representation of an integrated circuit test vehicle.

Specific embodiments of the invention are described in detail below. The embodiments were selected to illustrate various features of the invention, but should not be considered to limit the invention to the embodiments described, as the invention is susceptible to various modifications and alternative forms. The invention is to cover all modifications, equivalents, and alternatives falling within the spirit and scope of the invention as defined by the claims. In general, the embodiments were selected to highlight specific inventive aspects or features of the invention.

Throughout this specification, like reference numbers signify the same elements throughout the description of the figures.

When elements are referred to as being "connected" or "coupled," the elements can be directly connected or coupled together or one or more intervening elements may also be present. In contrast, when elements are referred to as being "directly connected" or "directly coupled," there are no intervening elements present.

The invention may be embodied as devices, systems, methods, and/or computer program products. Accordingly, some or all of the invention may be embodied in hardware and/or in software (including firmware, resident software, micro-code, state machines, gate arrays, etc.) Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. By way of example, and not limitation, computer readable media may comprise computer storage media and communication media.

Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an instruction execution system. Note that the computer-usable or computer-readable medium could be paper or another suitable medium upon which the program is printed, as the program can be electronically captured, via, for instance, optical scanning of the paper or other medium, then compiled, interpreted, of otherwise processed in a suitable manner, if necessary, and then stored in a computer memory.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

When the invention is embodied in the general context of computer-executable instructions, the embodiment may comprise program modules, executed by one or more systems, computers, or other devices. Generally, program modules include routines, programs, objects, components, data structures, etc. that perform particular tasks or implement particular abstract data types. Typically, the functionality of the program modules may be combined or distributed as desired in various embodiments.

Throughout this specification, the term "comprising" shall be synonymous with "including," "containing," or "characterized by," is inclusive or open-ended and does not exclude additional, unrecited elements or method steps. "Comprising" is a term of art which means that the named elements are essential, but other elements may be added and still form a construct within the scope of the statement. "Comprising" leaves open for the inclusion of unspecified ingredients even in major amounts.

FIG. 1 is a flowchart illustration of an embodiment 100 showing an integrated circuit test vehicle. Four upper layer process test circuits 102 and four lower layer process test circuits 104 are arranged in a 2×2 matrix. Data collection circuit 106 may be used to collect data when the process test circuits are connected in columns while data collection circuit 108 is similarly used when the process test circuits are connected in rows. The data collection circuit 106 comprises scan flip flops 110 and 112.

The row and column control circuits 114 may be arranged so that the process test circuits may be connected in series along the rows or columns of the 2×2 matrix. Additionally, the upper layer or lower layer sets of process test circuits may be selected by the muxes 116 and 118.

DataIn line 120 is input into the process test circuits through the row and column control circuits 114 and enters the columns in parallel. Alternatively, the data 120 may be switched so that it enters the rows in parallel. The switches 122 and 124 control the flow into either the upper layer process test circuits or the lower layer process test circuits.

In some embodiments, the process test circuits may be arranged in a large array of 10, 20, or 100 or more columns and rows. Some may be square matrices, with equal number of rows and columns, while others may have unequal numbers of rows and columns.

Process test circuits may be arranged in several layers within the integrated circuit. For example, one process test circuit may be formed in the first two or three layers of the integrated circuit, while a second process test circuit may be formed in the next two or three layers. In such an example, the process test circuits in the bottom layer may be connectable in one array while the upper layer process test circuits may be connectable in a second array. The embodiment 100 is such an example, with the muxes 116 and 118 being used to select one array over the other while the switches 122 and 124 direct the data to flow into the appropriate array. In other examples, three, four, or even more process test circuits may be layered on top of each other.

The process test circuits may be any type of test circuit usable to test the boundaries of an integrated circuit manufacturing process. For example, 'comb' circuits are known in the art. Additionally, serpentine circuits may contain a single trace of minimum width that is placed at a minimum spacing in a very long trace. Another example is a stair-step test circuit that contains many vias and connections up and down through several layers of the integrated circuit. Many different circuits are known in the art and may be developed in the future for testing process parameters. In many cases, process test circuits may include test points or other features that enable quick identification of problem areas so that a failure analysis engineer may efficiently isolate and analyze a failure.

The size of the process test circuits may vary from embodiment to embodiment. The actual size may be determined by company or industry standards, by personal preference, by the optimal size to fit on a tester or wafer, or by any other criteria.

The data collection circuits 106 and 108 may collect and store the signal data during a test. In one configuration, a set of scan flip flops may be used to store a plurality of parallel incoming data signals then send the data value to a host when a scan is initiated. In such a configuration, the data may be read in a series of bits. In another configuration, the data collection circuits may receive, process, and store incoming data signals one at a time. Such a configuration may be useful for testing several rows or columns in parallel. Some configuration may allow for all or a portion of the rows or columns to be tested in parallel. For example, a data collection circuit may allow eight rows or columns to be tested in parallel but may have 24 or more rows or columns.

The data collection circuits may collect, store, and process the data that passes through the process test circuits through any of a number of configurations. The configuration may depend on the number of data bits, the type of information to be stored, the interface used to collect the data, and other factors. Those skilled in the art may configure the data collection circuits 106 and 108 in various manners to suit the particular embodiment. In some embodiments, the data collection circuits 106 and 108 may be combined into a single data collection circuit that is switchably connected to receive data transmitted along the row or column direction of the array of process test circuits.

The circuits of embodiment 100 may be replicated many times over an entire integrated circuit wafer. In many cases, a designer may find it useful to design a standardized array of N×N process test circuits into a test cell. The test cell may be replicated in a larger array with several different forms, such as with varying trace widths or other parameter, or with completely different process test circuits. The array of test cells may be further replicated over the surface of an entire wafer.

In some instances, there is an advantage to manufacturing an entire wafer of test cells, each containing many test circuits such as embodiment 100. For example, process variation across a wafer may be characterized and analyzed. Further, such a wafer may yield a very large number of data points for process test data in a single wafer.

In some instances, the circuit 100 may be placed on a portion of a wafer that is used to manufacture other circuits. The circuit 100 may be tested on every wafer or sampled over many wafers to determine if certain process parameters are being properly controlled.

Figure 2:
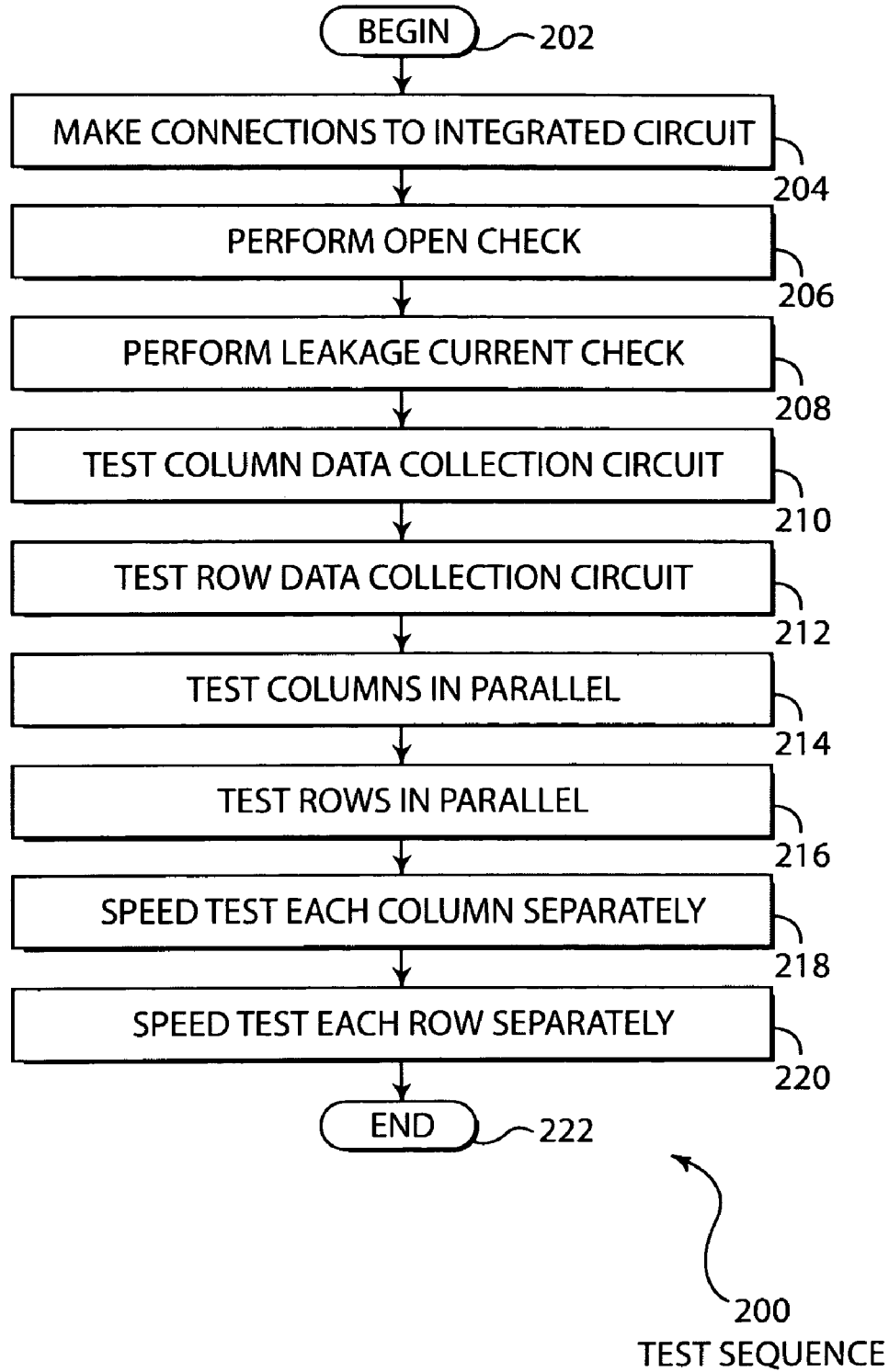
FIG. 2 is a flow chart representation of a method of a test sequence.

FIG. 2 illustrates an embodiment 200 of a test sequence used to test the circuit 100. The process begins in block 202. After physical probe connections are made to the integrated circuit in block 204, an open check is performed in block 206 as well as a leakage current check in block 208. The column data collection circuit is tested in block 210 and the row data collection circuit is tested in block 212. The columns and rows are tested in parallel in blocks 214 and 216. Each column is tested separately in a 'speed test' in block 218, and likewise each row is speed tested in block 220. The process ends in block 222.

The testing and analysis of test results will be discussed in two parts for the purposes of this specification. In some embodiments, a test apparatus may be capable of collecting test data that is subsequently evaluated on the same or another system. In some cases, the evaluation and analysis of data may be performed on a general purpose computer running data analysis programs. In other embodiments, the data collection and analysis may be performed substantially simultaneously on one system.

The test sequence may include preliminary tests, tests conducted in parallel, and tests conducted separately. The preliminary tests may include open checks as in block 206, leakage current check as in block 208, and testing the data collection circuits as in blocks 210 and 212. Depending on the test apparatus, the design of the test vehicle, processing and switching capabilities of the test apparatus and test vehicle, company standards, preferences of the testing engineer, or other factors, the particular preliminary tests and test sequences may be varied while keeping within the spirit and intent of the present invention.

An open check and leakage current check as in blocks 206 and 208 may test the connections and gross operational level of the test vehicle. In some embodiments, if the open check and leakage current check are not satisfactory, the testing procedure may be halted, while in others, the test may continue. As described hereinafter, a failure in an open check or leakage current check may taint the test results of some process test circuits. Such test results may be ignored so that they do not corrupt the overall analysis.

The column and row data collection circuits may be tested in blocks 210 and 212. These circuits may have a self test feature or may have a method by which the data collection circuits may be at least partially isolated and tested for proper operation. The specific method of testing and the data collected from such a test is dependent on the design of the data collection circuit, and may vary from one embodiment to another. The purpose of the data collection tests of blocks 210 and 212 is to perform at least a cursory verification that the circuits are functional. In some embodiments, the data collection circuits may not be independently testable at all, and thus such tests may not be performed.

The rows and columns of the array of process test circuits may be tested in parallel in some embodiments as in blocks 214 and 216. In some embodiments, the data collection circuits may enable all of the rows or columns to be tested simultaneously. In such an embodiment, the process test circuits may be connected to their neighbors so that they are connected in series to form a row or column. Data signals may be sent substantially simultaneously to all of the first process test circuits in the series, and the data may propagate along the rows to the data collection circuits. The array may then be reconfigured and tested along the columns.

In the speed testing of blocks 218 and 220, each column or row may be tested separately and with an emphasis on timing the signal propagation along one row or column at a time. An example of such a method is described in FIG. 3.

Various test sequences may be used by those skilled in the art for generating test data for analysis. Because the process test circuits are able to be tested by two different test paths, a failure in one process test circuit may be isolated by comparing the failures of two intersecting test paths.

Figure 3:
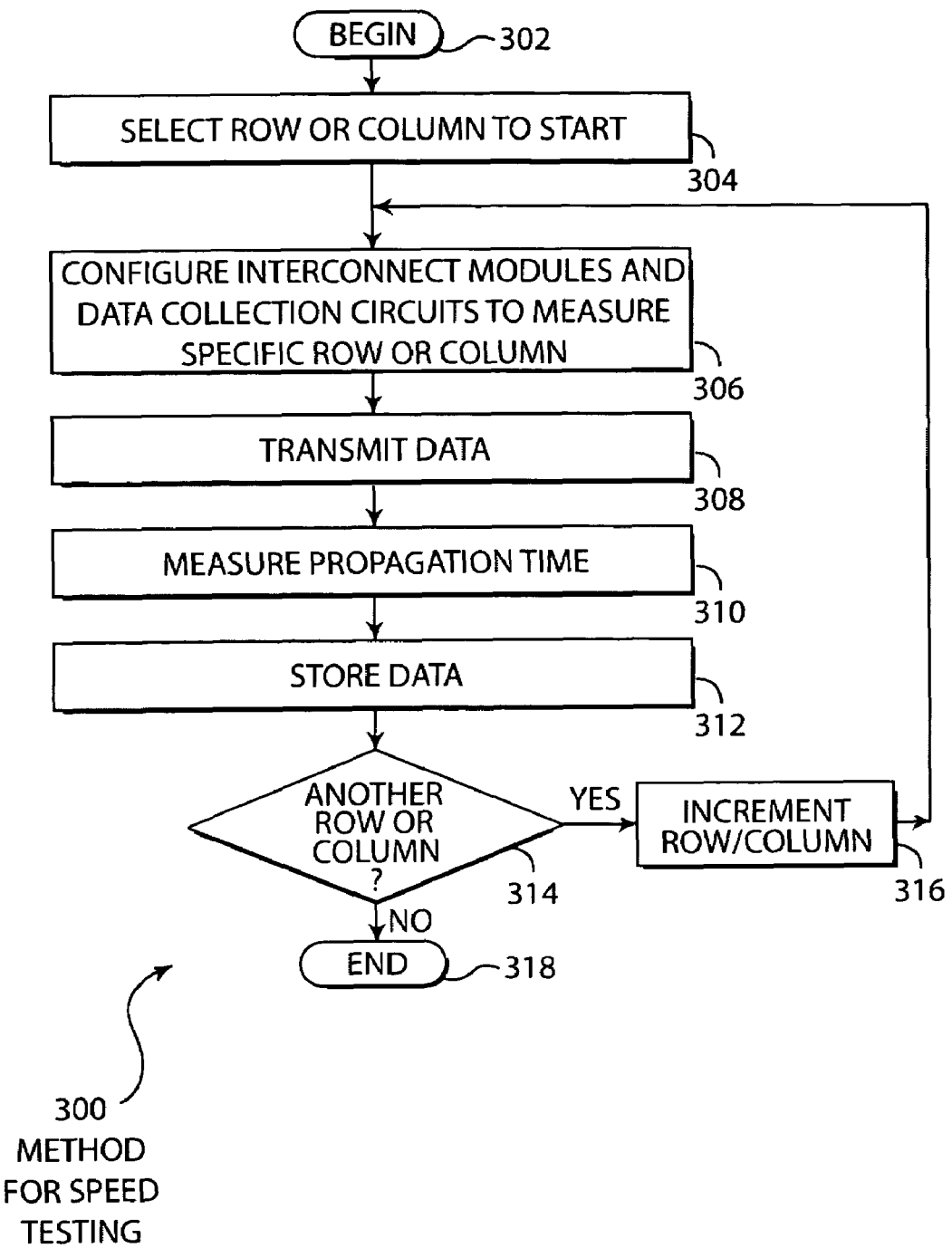
FIG. 3 is a flow chart representation of a method of a speed test.

FIG. 3 illustrates an embodiment 300 of a method for speed testing a single row or column. The process begins in block 302. In block 304, the control circuits and data collection circuits may be configured to measure a specific row or column. The data are transmitted along the row or column in block 308 and the propagation time is measured in block 310. The timing data and propagated data may be stored in block 312. If another row or column is still to be tested in block 314, the row or column is incremented in block 316 and the process continues to block 306, otherwise the process ends in block 318.

In various embodiments, the propagation timing of a signal may or may not be measured. When timing is measured, the data collection circuits may be capable of testing rows or columns of process test circuits simultaneously or separately in the timing tests.

When the data collection circuits are capable of testing only one row or column individually to determine propagation delay through the connected process test circuits, the method 300 is one method for doing so. Each row or column is configured for testing, then data is sent through the array and the propagation delay is determined for that particular row or column.

Figure 4:
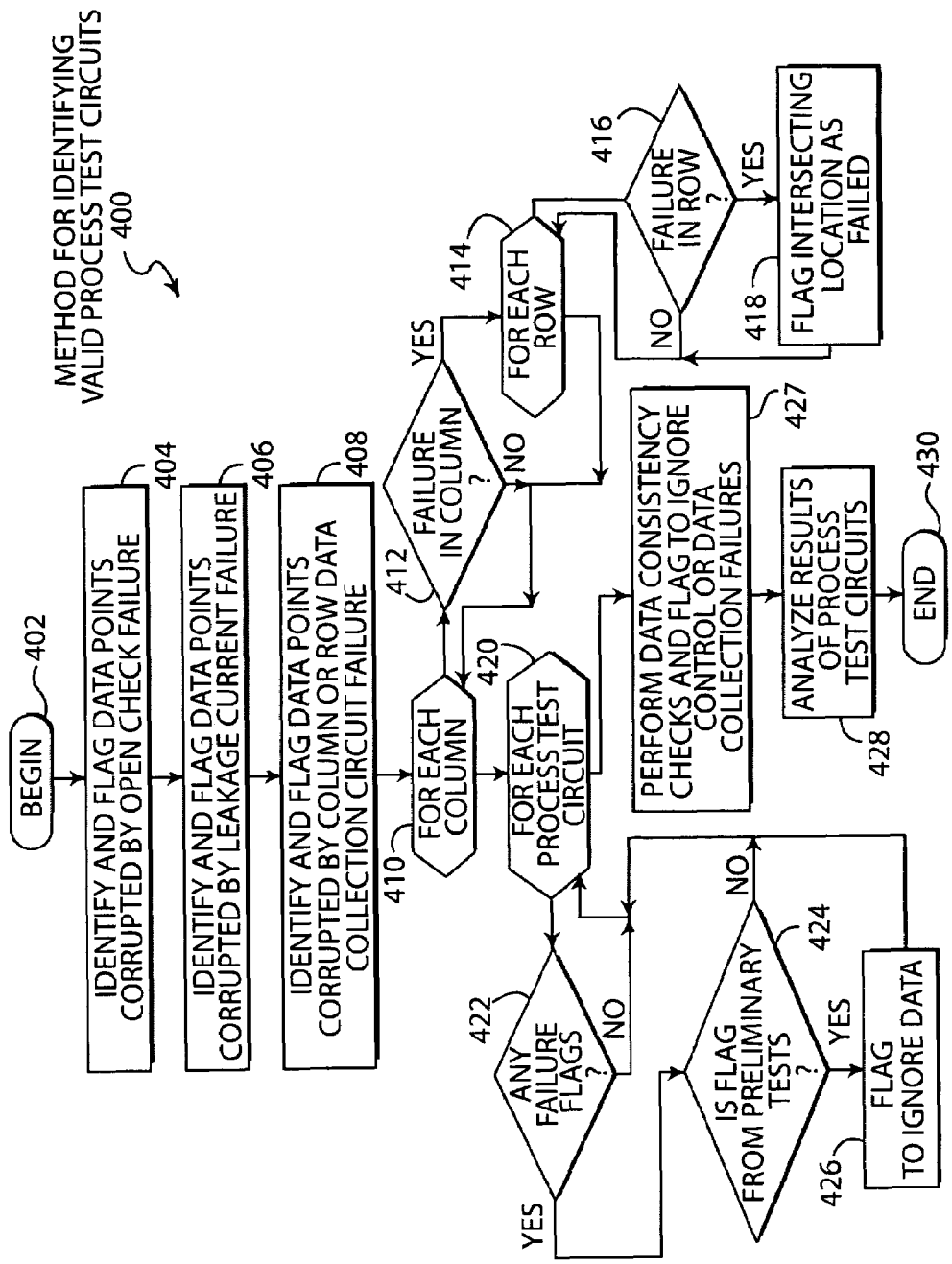
FIG. 4 is a flow chart representation of a method of identifying valid process test circuit failures.

FIG. 4 illustrates an embodiment 400 of a method for identifying valid process test circuit data. The process begins in block 402. Any data points that may be corrupted by open check failures or leakage current failures are identified in blocks 404 and 406, respectively. Similarly, any data points corrupted by data collection circuit failures are identified and flagged in block 408. For each column in block 410, if there is a failure in the column in block 412, the process moves to block 414, otherwise the process continues with the next column in block 410. For each row in block 414, if there is a failure in the row in block 416, the intersecting location is flagged as failed. The process returns to block 414 for the next row.

After each process test circuit or data point has been flagged with any failures, each process test circuit is evaluated in block 420. If there is a failure flagged for the process test circuit in block 422, and in block 424 the flag is from the preliminary tests found in blocks 404, 406, and 408, the data for that process test circuit is flagged to be ignored in block 426. After each process test circuit data point is flagged as either ignore or as good data, data consistency checks may be performed to flag and ignore control or data collection failures in block 427. The results of the tests may be analyzed in block 428. The process ends in block 430.

A failure may be any data that varies from an expected value. In some cases, a data value may have a predefined range. A value outside of the predefined limit may be considered a failure. The data parameter may be any measurable value.

Embodiment 400 illustrates one method for determining in which process test circuit a failure occurred and if that failure is a valid failure. All data points representing process test circuit failures that may be adversely effected by any preliminary test is flagged in blocks 404, 406, and 408. A failure of the data collection circuit or other preliminary tests may create several false failures in the process test circuits. These data points are ignored so that they do not corrupt the final analysis.

Embodiment 400 removes from analysis any process test circuit data that may be corrupted by control circuit failures, data collection failures, or any other non-process test circuit failures. By removing corrupted or doubtful data, the remaining data is much more likely to be reliable process test circuit performance data and less likely to be other failures. The analysis of block 428 may include determining performance characteristics of the process test circuit portions of the yield analysis vehicle.

Another aspect of the embodiment 400 illustrates how failures in individual process test circuits are identified in blocks 410 through 418. Since each process test circuit may have been tested when the data path flows in both the column and row arrangements, a failure of that process test circuit would result in a failure of both the column and row test results. Thus, the intersection of the two orthogonal but failing data paths may be considered a failure.

The arrangement has a significant reduction in both testing time and data analysis time over testing each process test circuit individually. For example, if 100 process test circuits were to be tested, testing each process test circuit individually would require 100 individual tests. Arranging 100 process test circuits in a 10×10 array and testing them in a fashion similar to embodiments 100, 200, 300, and 400 would require only 20 speed tests and two parallel tests, for a total of 22 tests.

A distinct advantage over testing each process test circuit individually is that the failure may be isolated between the process test circuits and the control circuits or the data collection circuits, depending on the design of such circuits and the layout of the test vehicle. Since each data collection circuit is used several times, paired with several different process test circuits in independent tests, a failure can be attributed to either the process test circuit or the data collection and control circuits. The advantage is that failures may be determined with much greater confidence than with other methods. Because of a higher confidence, fewer data points are required for significant results, resulting in fewer test vehicles being needed and less test and analysis time.

Embodiment 400 is merely one example of a method for determining which process test circuit may have failed. In some embodiments, the pass/fail data may be arranged in the form of an address, with the addresses relates to the physical location of a particular process test circuit.

Those skilled in the art will appreciate that many different methods may be used to identify the intersecting process test circuit, including variations of the embodiment 400 or completely different methods.

The data consistency checks of block 427 may be any type of consistency checks that may help isolate data collection and control circuit failures from process test circuit failures. Several examples of such tests are illustrated using the circuit of FIG. 5.

Figure 5:
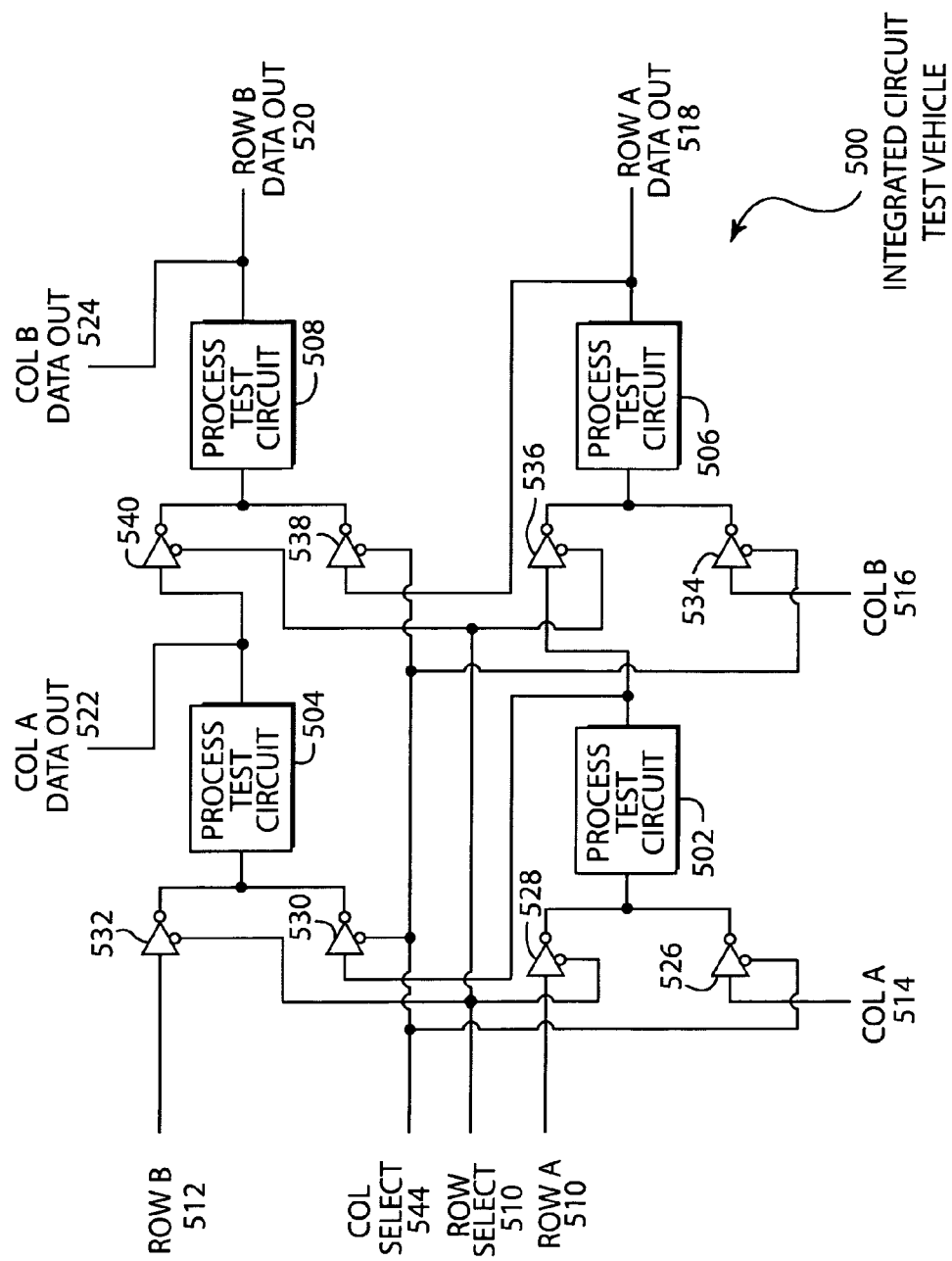
FIG. 5 illustrates an embodiment of an integrated circuit test vehicle.

FIG. 5 illustrates an embodiment 500 of an integrated circuit test vehicle. The process test circuits 502, 504, 506, and 508 are arranged in a 2×2 array. The data inputs are row A 510, row B 512, column A 514, and column B 516. The data outputs are row A 518, row B 520, column A 522, and column B 524. The tristate inverters 526, 528, 530, 532, 534, 536, 538, and 540 are controlled by row select 542 and column select 544 to allow the flow of data in the row or column arrangement.

In order to configure the array into column or row arrangements, either one of the row select 542 or column select 544 lines are brought high. This causes the various tristate inverters to allow data to flow in the proper direction.

The use of tristate inverters causes the data signals to be inverted before each process test circuit. For example, if row select 542 is high, the process test circuits are arranged in a row configuration. Thus, a high data signal in row A 510 is inverted at tristate inverter 528, and flows through process test circuit 502 in a low state, is inverted to a high state at tristate inverter 536, and flows through process test circuit 506 in a high state. If the process test circuits are working properly, the result in row A output should be high. Similarly, if the data input is low at row A 510, the data output 518 should be low.

Continuing the example, if process test circuit 502 is shorted to ground, the input high signal would still result in a high signal for output 518. However, an input low signal would result in a high signal for output 518. This is because the input low signal at 510 is converted to a high signal at the tristate inverter 528, but is shorted to ground in the process test circuit 502. Thus, a low signal goes to tristate inverter 536 and is converted to high for passage through the process test circuit 506 and output 518. Using a shorthand notation, a (0,1) input to line 510 results in a (1,1) output on line 518 when process test circuit 502 is shorted to ground.

If process test circuit 506 is shorted to ground instead of process test circuit 502, the reader can see that a low input 510 and a low output 518. Similarly, a high input 510 results in a low output 518. Using the shorthand notation, a (0,1) input results in a (0,0) output.

In this example, the use of inverters may be used to indicate whether a failure is an even or odd member of the sequence, regardless of the number of process test circuits that are in the series. This arrangement allows a polarity check to be done to confirm a process test circuit failure or indicate a control circuit or data collection circuit failure.

When a failure occurs in a process test circuit, the failure will be evident in the intersection of a row and column. However, the failures for a row and column should indicate that the polarity of the failure, meaning either odd or even numbered process test circuit, corresponds with the expected row and column. Using the shorthand notation above, a (0,1) input that yields a (0,0) output indicates an even numbered process test circuit failure, i.e., the second process test circuit 506. If the results were a failure in row A and column A, the intersection appears to indicate that process test circuit 502 failed, while the row analysis indicates that only an even numbered process test circuit failed. When the results are inconsistent, a failure may have occurred in either the control circuitry, such as the various tristate inverters, or data collection circuitry not shown in the figure.

Further analyzing the example, if the data collection circuitry has been tested using self test circuitry or having successfully received and processed input data in high and low states using another path, the control circuitry may be suspect. Still analyzing the example, if the row A test of (0,1) yields a (0,0) result, indicating that process test circuit 506 failed, but the column B test of (0,1) yields a (0,1) result indicating that both process test circuits 506 and 508 are working properly, the process test circuit 506 may be assumed to be functioning properly but the control circuit may have failed.

Thus, several analysis steps may be used to analyze test data to further isolate passing and failing process test circuits from failures in control circuits or data collection circuits.

One analysis step may include looking for row failures without a corresponding column failure and vice versa. If a process test circuit actually failed, it is likely to be indicated in the intersection of a row and column failure. The failure of a row without a column failure, or a column failure without a row failure, most likely indicates the presence of a control failure and not a process test circuit failure.

Another analysis step is to correlate the expected row or column failure with the actual corresponding column or row failure when inverters are used within the series. Such a step is known as a polarity check. If the expected failure indicates an even row or column, the intersecting row or column should be even numbered. If the intersecting row or column is not evenly numbered, then a control circuit failure or data collection failure may have occurred. Those process test circuits that are not within the intersection may be assumed passing, and also the intersecting process test circuit may be assumed good.

Yet another analysis step is applicable to yield vehicles where one set of process test circuits are arranged in a layer above another set of process test circuits, such as is illustrated in FIG. 1. When a failure occurs in the same location of the upper and lower arrays, there may be an interaction or short between the upper process test circuit and the lower process test circuit. Such a situation may be specially flagged for failure analysis.

Those skilled in the arts will appreciate that these various analysis steps assume that the number of failures is relatively small. For example, in a 10×10 array, one may expect only one or two failures of process test circuits, and even fewer failures of control circuits. If there failures were much higher, the specific location of the failures may become indeterminate, since several failures may combine to appear as one failure and may give other unexpected results. In practice, the number of failures tends to be very minimal and the inventive analysis is particularly useful.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system comprising:
   an integrated circuit comprising:
   a plurality of process test circuits;
   at least two data collection circuits; and
   a control circuit capable of switching one or more of said plurality of process test circuits to connect to one of said at least two data collection circuits;
   a test device adapted to connect to at least one of said plurality of process test circuits, set said control circuit to one of said at least two data collection circuits, send signals through said process test circuits, and collect a plurality of sets of data using said at least two data collection circuits for more than one combination of said process test circuits and said at least two data collection circuits;
   a test analyzer adapted to compare said plurality of sets of data, determine that a failure exists, and isolate said failure to one or more of said plurality of process test circuits, said at least two data collection circuits, or said control circuit.

2. The system of claim 1 wherein said test analyzer is further adapted to:
   compare first data comprising failing test results of a first process test circuit and a first data collection circuit to second data comprising passing test results of a second process test circuit and said first data collection circuit, and isolate a failure in said first process test circuit.

3. The system of claim 1 wherein said test analyzer is further adapted to:
   compare first data comprising failing test results of a first process test circuit and a first data collection circuit to second data comprising passing test results of said first process test circuit and a second data collection circuit, and isolate a failure in said second data collection circuit.

4. The system of claim 1 wherein at least some of said plurality of process test circuits are arranged such that a signal is inverted between at least two of said process test circuits.

5. The system of claim 4 wherein a process test circuit failure is confirmed by comparing an expected test result with an actual test result using a polarity check.

6. The system of claim 4 wherein a control circuit failure or data collection failure is confirmed by comparing an expected test result with an actual test result using a polarity check.

7. The system of claim 1 wherein at least a portion of one of said plurality of process test circuits is located above at least a portion of a second of said plurality of process test circuits.

8. The system of claim 1 wherein said plurality of process test circuits are arranged in a row and column arrangement.

9. The system of claim 8 wherein a first set of said plurality of process test circuits is located substantially below a second set of said plurality of process test circuits.

10. A method comprising:
    testing a first process test circuit and recording first data using a first data collection circuit;
    testing a second process test circuit and recording second data using said first data collection circuit;
    testing said first process test circuit and recording third data using a second data collection circuit;

testing said second process test circuit and recording fourth data using said second data collection circuit; and comparing said first data, said second data, said third data, and said fourth data to isolate a failure in one of said first process test circuit, said second process test circuit, said first data collection circuit, and said second data collection circuit;

wherein said first process test circuit, said second process test circuit, said first data collection circuit, and said second data collection circuit are all embodied on a single integrated circuit.

11. The method of claim 10 wherein said comparing comprises:

determining a failure in said first data and said third data; and isolating a failure in said first process test circuit.

12. The method of claim 10 wherein said comparing further comprises:

confirming said failure by performing a polarity check.

13. The method of claim 10 wherein said comparing comprises:

determining a failure in said first data and said second data; and isolating a failure in said first data collection circuit.

14. The method of claim 13 wherein said comparison further comprises:

confirming said failure by performing a polarity check.

15. The method of claim 10 wherein at least a portion of said first process test circuit is located above at least a portion of said second process test circuit.

16. The method of claim 10 further comprising a plurality of process test circuits arranged in a row and column arrangement.

17. The method of claim 16 further comprising a first set of process test circuits located substantially below a second set of process test circuits.

* * * * *